(12) United States Patent
Culpi et al.

(10) Patent No.: US 11,784,588 B2
(45) Date of Patent: Oct. 10, 2023

(54) DUAL MODE MOTION CONTROL SYSTEM AND METHOD FOR PIEZO MOTOR

(71) Applicant: Physik Instrumente (PI) GmbH & Co. KG, Karlsruhe (DE)

(72) Inventors: William Culpi, Lake Forest, CA (US); Jérôme Kneipp, Sundhoffen (FR)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 589 days.

(21) Appl. No.: 16/980,939

(22) PCT Filed: Mar. 21, 2019

(86) PCT No.: PCT/IB2019/052308
§ 371 (c)(1),
(2) Date: Sep. 15, 2020

(87) PCT Pub. No.: WO2019/186334
PCT Pub. Date: Oct. 3, 2019

(65) Prior Publication Data
US 2021/0006180 A1 Jan. 7, 2021

(30) Foreign Application Priority Data
Mar. 29, 2018 (EP) .................... 18164871

(51) Int. Cl.
*H02N 2/06* (2006.01)
*H03M 1/66* (2006.01)
(52) U.S. Cl.
CPC ................ *H02N 2/06* (2013.01); *H03M 1/66* (2013.01)

(58) Field of Classification Search
CPC ........ H02N 2/06; H02N 2/142; H02N 2/0075; H03M 1/66
(Continued)

(56) References Cited

U.S. PATENT DOCUMENTS 6,476,537 B1 * 11/2002 Pease ..................... H02N 2/101
310/317
6,707,231 B2 * 3/2004 Pease ..................... H02N 2/101
310/317
(Continued)

FOREIGN PATENT DOCUMENTS

WO         0215379 A1    2/2002
WO      2018134637 A1    7/2018

OTHER PUBLICATIONS

Extended European Search Report issued by the European Patent Office for Application No. 18164871.8 dated Oct. 8, 2018 (5 pages).
(Continued)

*Primary Examiner* — Rina I Duda
(74) *Attorney, Agent, or Firm* — Michael Best & Friedrich LLP

(57) ABSTRACT

A motion control system and method for controlling a stick-slip piezo motor includes an electronic controller and an analog driver for moving a mechanical device. When operating in a digital circuit mode, an electronic controller controls a digital-to-analog converter for moving the stick-slip piezo motor at a low speed. When operating in a faster analog circuit mode, the electronic controller, via an analog driver, operates to control an analog hardware circuit to move the stick-slip piezo motor at a high speed. The electronic controller operates in the digital circuit mode at start-up of the piezo motor.

20 Claims, 5 Drawing Sheets

(58) Field of Classification Search
USPC .......................................................... 318/114
See application file for complete search history.

(56) References Cited

U.S. PATENT DOCUMENTS

| | | | | |
|---|---|---|---|---|
| 8,415,903 | B2* | 4/2013 | Yoshimura | H02N 2/008 |
| | | | | 318/116 |
| 2003/0006722 | A1* | 1/2003 | Hayashi | H02N 2/14 |
| | | | | 318/114 |
| 2004/0150357 | A1* | 8/2004 | Endo | H02P 8/08 |
| | | | | 318/114 |
| 2010/0314970 | A1 | 12/2010 | Culpi et al. | |
| 2014/0084751 | A1* | 3/2014 | Suzuki | H02N 2/025 |
| | | | | 310/317 |
| 2015/0076965 | A1 | 3/2015 | Culpi | |

OTHER PUBLICATIONS

International Search Report and Written Opinion for Application No. PCT/IB2019/052308 dated Jul. 15, 2019 (12 pages).

* cited by examiner

DUAL MODE MOTION CONTROL SYSTEM AND METHOD FOR PIEZO MOTOR

CROSS-REFERENCE TO RELATED APPLICATIONS

This patent application is the U.S. national stage entry, under 35 U.S.C. § 371, of international application number PCT/IB2019/052308, filed Mar. 21, 2019, which claims priority to European Patent Application No. 18164871.8, filed Mar. 29, 2018, the entire contents of each of which are incorporated herein by reference.

BACKGROUND

The present invention relates to a motion control system and method for a stick-slip piezo motor.

Stick-slip piezo motors are known in the prior art. One example of a stick-slip piezoelectric motor is disclosed in U.S. Patent Pub. 2015/0076965. A physical structure includes a coupling pad and a friction pad.

Another stick-slip piezo motor is disclosed in International PCT Appl. No. PCT/IB2017/000554 filed Apr. 24, 2017. The piezoelectric motor has a piezo stack and a strip for movement between a retracted position and an extended position. Pads engage with actuation surfaces and a spring head is engageable with each of the pads.

SUMMARY

In one embodiment, a motion control system for operating a stick-slip piezo motor comprises an analog hardware circuit for providing a high speed waveform at high operating speeds, an analog driver for driving the analog hardware circuit, and a digital-to-analog converter for converting digital signals into analog signals for providing a low speed waveform at low operating speeds. The motion control system further includes a mode switch for selecting one of an output from the analog hardware circuit and an output from the digital-to-analog converter, and an electronic controller in communication with the analog driver, the analog hardware circuit, the digital-to-analog converter, and the mode switch. The electronic controller is configured to: control the digital-to-analog converter to output a low speed waveform, control the analog driver to drive the analog hardware circuit to output a high speed waveform, and control the mode switch to provide the high speed waveform from the analog hardware circuit to the piezo motor or to provide the low speed waveform from the digital-to-analog converter to the piezo motor.

In another embodiment, a method for controlling a stick-slip piezo motor with an electronic controller and an analog driver for moving a mechanical device when movement is selected is provided. The method includes operating in a digital circuit mode with the electronic controller to move the stick-slip piezo motor at a low speed, and selectively operating in an analog circuit mode with the electronic controller and the analog driver to move the stick-slip piezo motor at a high speed. The electronic controller operates in the digital circuit mode at start-up of the piezo motor.

Other aspects of the invention will become apparent by consideration of the detailed description and accompanying drawings.

DETAILED DESCRIPTION

Before any embodiments are explained in detail, it is to be understood that the embodiments are not limited in application to the details of construction and the arrangement of components set forth in the following description or illustrated in the following drawings. Other embodiments are capable of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1:
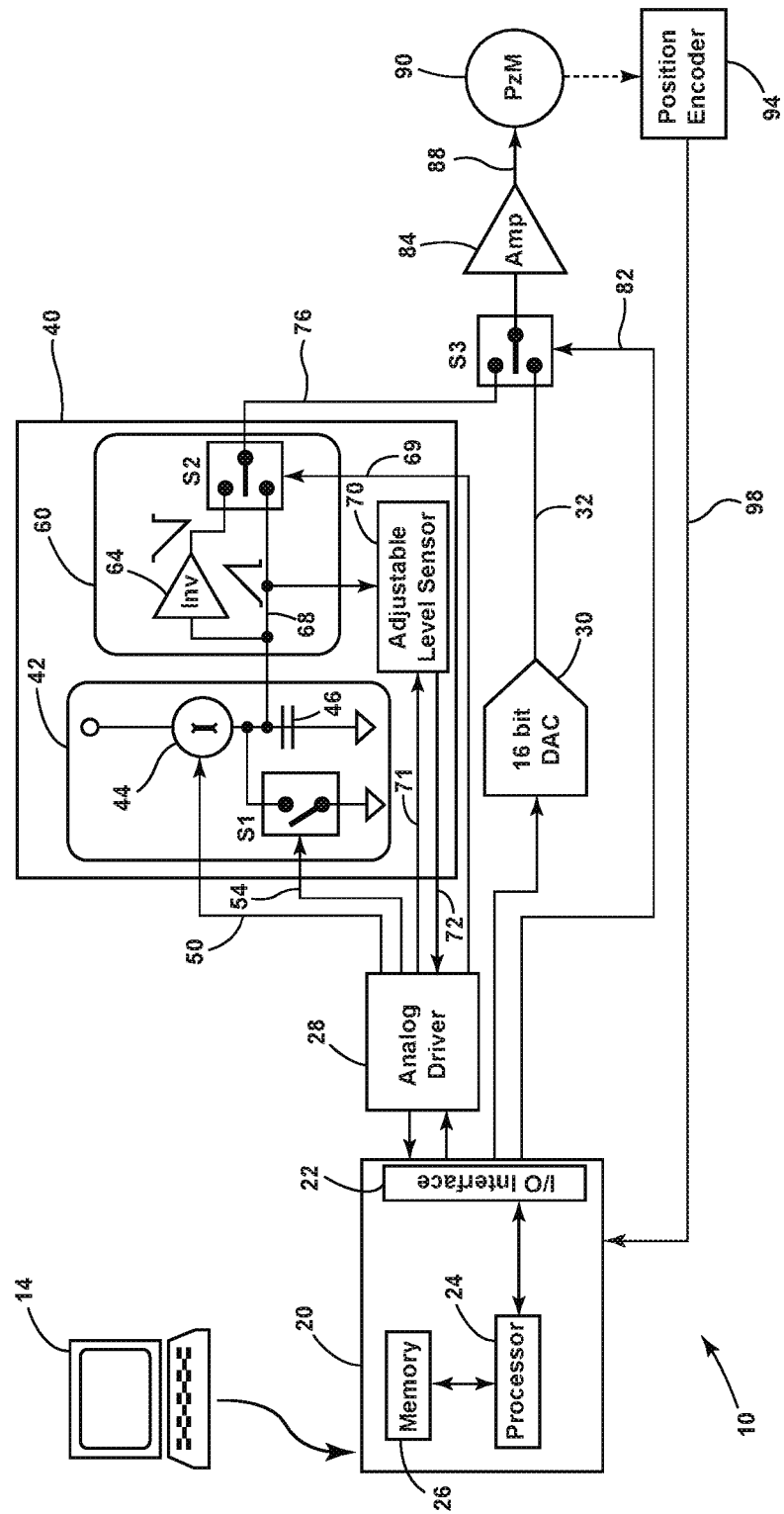
FIG. 1 is a block diagram for an embodiment of a motion control system.

FIG. 1 shows a block diagram of a dual mode motion control system 10. The dual mode motion control system 10 includes a user interface 14 that provides inputs to an electronic controller 20. The electronic controller 20 includes an input/output (I/O) interface 22, a processor 24, and a memory 26. The processor 24 is configured to execute instructions stored in the non-volatile memory 26.

FIG. 1 shows an analog driver 28 that connects to multiple devices and communicates with the processor 24 of the controller 20 via the I/O interface 22. In one embodiment, the analog driver 28 is an application specific integrated circuit (ASIC). In another embodiment, the analog driver 28 is analog circuitry combined with the processor 24 as components of a digital signal processor (DSP). The analog driver 28 is configured to operate at a faster speed than the processor 24.

It should be understood that the electronic controller 20 shown in FIG. 1 can include multiple processors, additional computer-readable memory, multiple I/O interfaces, and/or additional components or modules (e.g., hardware, software, or a combination thereof).

The processor 24 shown in FIG. 1 receives information from at least the analog driver 28 and processes the information by executing instructions for one or more software modules (which may also be referred to as a "program") stored in a memory 26 of the electronic controller 20. The processor 24 stores information to and retrieves information from the memory 26, and information generated by programs executed by the processor 24. The memory 26 includes non-transitory memory and volatile memory, or a combination thereof. The non-transitory memory is computer readable. In various constructions, the memory 26 may also store operating system software, applications/instructions data, and combinations thereof. In another embodiment, an application specific integrated circuit (ASIC) performs the operations of the processor 24.

The dual mode motion control system 10 shown in FIG. 1 includes a digital-to-analog converter (DAC) 30 for operating in a digital circuit mode. In one embodiment, the DAC 30 is a 16 bit device that receives a digital input from the electronic controller 20 and provides an analog output signal on a signal line 32 as a low speed waveform. Thus, the DAC 30 is provided for converting digital signals into analog signals.

The dual mode motion control system 10 includes an analog hardware circuit 40 for providing an analog output signal as a high speed waveform. The analog hardware circuit 40 includes a high speed slope generator 42. The high speed slope generator 42 includes a discharge switch S1, a current source 44 and a reference capacitor 46. The current source 44 is in series with the reference capacitor 46. The discharge switch S1 is connected in parallel with the reference capacitor 46 to ground. A control signal line 50 provides a control signal from the analog driver 28 to control the current source 44. A control signal line 54 provides a control signal from the analog driver 28 to the discharge switch S1. The discharge switch S1 is an open/close or on/off switch.

The analog hardware circuit 40 shown in FIG. 1 includes a slope inverter circuit 60 having an inverter 64 with an input electrical connection to a control signal line 68 that is between the current source 44 and the reference capacitor 46. The slope inverter circuit 60 includes a motion direction switch S2 having a first input connector connected to an output of the inverter 64 and a second input connector connected to the signal line 68. Thus, the motion direction switch S2 has two input connectors to selectively provide an output of a drive signal therefrom. Finally, the motion direction switch S2 receives a control input from the analog driver 28 via a control signal line 69.

The analog hardware circuit 40 includes an adjustable voltage level sensor 70 for sensing a voltage level for the signal on the signal line 68. The adjustable voltage level sensor 70 receives a predefined or selected voltage level value from the analog driver 28 on signal line 71 for comparison with a sensed voltage value. The voltage level sensor 70 provides an output to the analog driver 28 on signal line 72 when the predefined voltage level value is exceeded.

The dual mode motion control system 10 shown in FIG. 1 includes a mode switch S3 that has an input connected to a signal line 76 that receives an output from the motion direction switch S2 and an input connector that receives a signal from an output signal line 32 of the DAC 30. Finally, the mode switch S3 includes a control input connector that receives a control signal from the electronic controller 20 via a control signal line 82.

The dual mode motion control system 10 shown in FIG. 1 further includes an amplifier 84 having an output signal line 88 for amplifying an output signal received via the mode switch S3 and provides an amplified output on the output signal line 88 to a piezo motor 90.

The electronic controller 40 is in communication with at least the analog driver 28, the analog hardware circuit 40, the digital-to-analog converter 30, and the mode switch S3.

In some embodiments, the electronic controller 20 determines a position for the piezo motor 90 based on calculations and programmed information provided by the memory 26 or by inputs from the user interface 14. Thus, the electronic controller 20 operates in an open loop system that is free from a position encoder.

In another embodiment, a position encoder 94 shown in FIG. 1 determines physical position data of the piezo motor 90 and the mechanical device associated therewith. The position encoder is connected to provide the physical position data to the electronic controller 20 on signal line 98.

Operation

Figure 2:
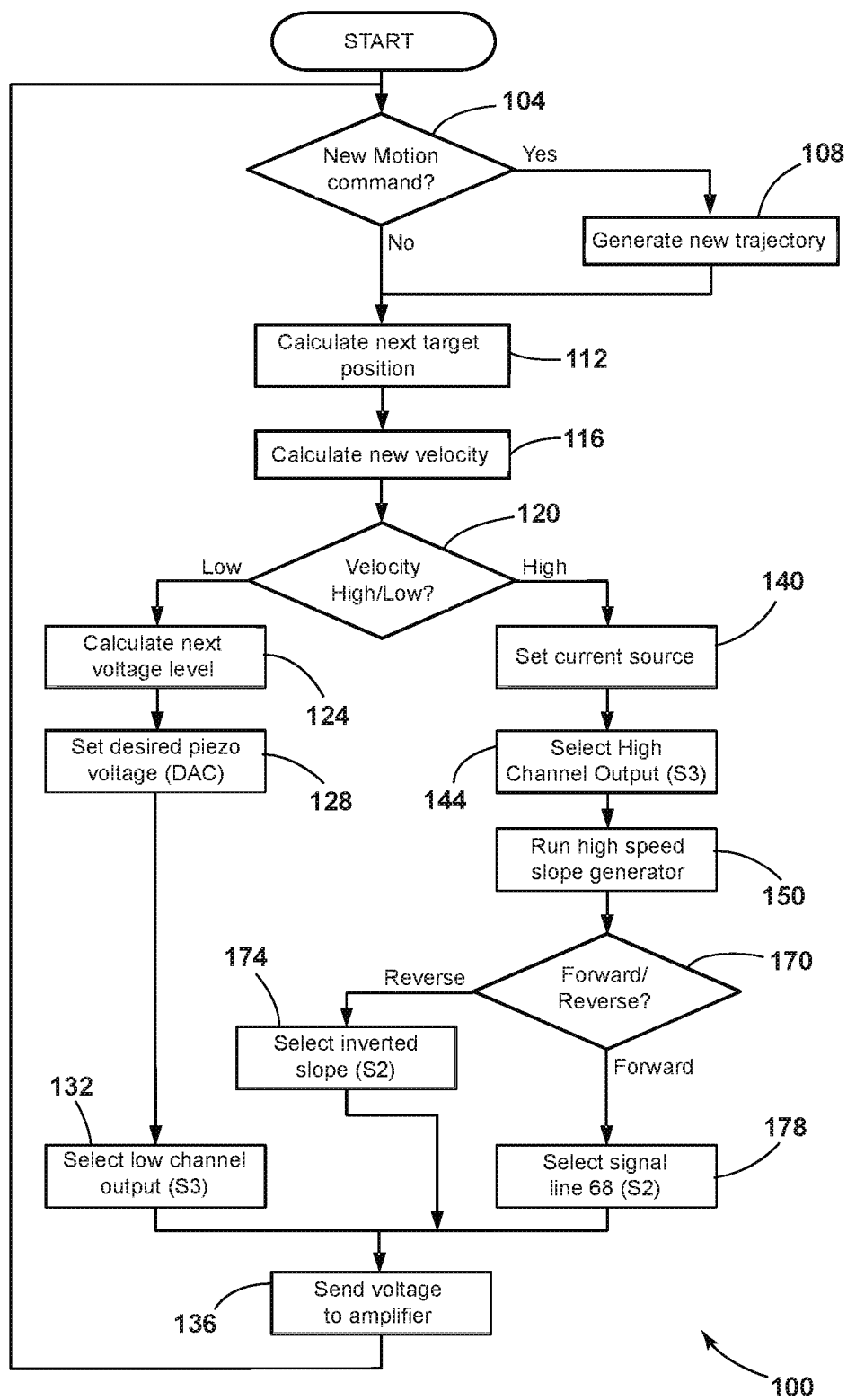
FIG. 2 is a flow chart for an embodiment for operating in dual mode motion control between a digital circuit mode and an analog circuit mode.
Figure 3:
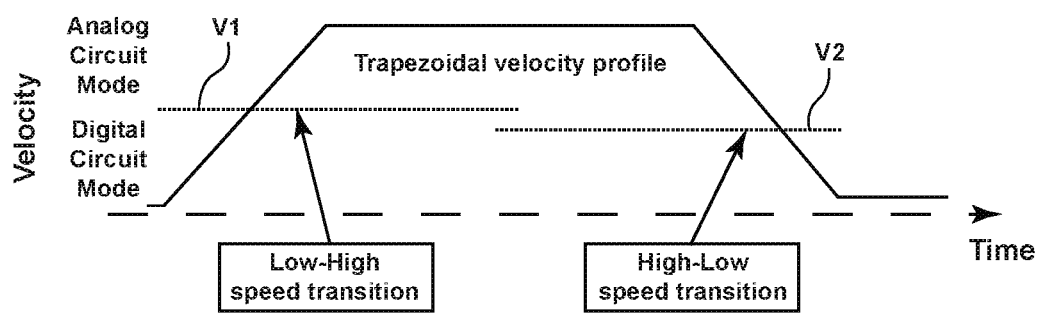
FIG. 3 is a graph showing velocity profile for one embodiment.

In operation, the dual mode motion control system 10 shown in FIG. 1 executes a method for controlling a stick-slip piezo motor in a manner illustrated by a flow chart 100 shown in FIG. 2 in one embodiment. Upon start-up operation, the electronic controller 20 determines whether a new motion command is provided (step 104). When a new trajectory having a motion and direction is required in view of commands received from the user interface 14, the processor 24 processes commands or otherwise operates to generate a motion profile (step 108). One example of a motion profile is the trapezoidal velocity profile shown in FIG. 3. The profile corresponds to a predetermined or calculated movement of a mechanical device by the piezoelectric motor 90. The velocity profile shown in FIG. 3 includes velocity on a vertical direction and time on a horizontal direction. FIG. 3 shows operation of the DAC 30 in the digital circuit mode until a low to high speed transition velocity threshold V1 is achieved. Upon achieving the predefined operating speed or velocity threshold V1, the electronic controller 20 of the dual mode motion control system switches to the analog circuit mode by utilizing the analog driver 28 and the analog hardware circuit 40, along with mode switch S3. When the piezoelectric motor 90 has reached maximum speed and moved a mechanical device a certain distance, the analog circuit mode beings to slow down. When high to low speed transition velocity threshold V2 is reached, the electronic controller 20 switches back to digital circuit mode. The velocity threshold V2 or predefined operating speed is less than the velocity threshold V1 in one embodiment.

Returning to FIG. 2, after generating a new trajectory (step 108), the electronic controller calculates a next target position for movement (step 112) and a new target velocity (step 116). A program than determines whether the target velocity corresponds to a value greater than or equal to velocity threshold V1 (step 120). Initially, the velocity is low. Thus, the electronic controller (step 120) advances to calculating the next voltage level (step 124) and then setting a desired piezoelectric voltage for output (step 128). Thereafter, the controller 20 either sets the mode switch S3 to receive an input from the DAC 30 or maintains the mode switch connected to the DAC 30 (step 132). Thereafter, the voltage from the DAC 30 is provided via the mode switch S3 to the amplifier 84 (step 136). The amplifier 88 provides a drive voltage to the piezoelectric motor 90 for moving the associated mechanical device.

The program executed by the processor 24 of the controller 20 returns (step 104). As no new motion command is generated (decision step 104), the processor 24 returns to calculate a next target position (step 112) and then a new increased velocity (step 116). As the velocity remains below threshold V1 (step 120), the processor 24 advances to and repeats the steps (steps 124, 128, 132, 126). At each return through the flow chart the voltage output is increased in a somewhat stepped way as the DAC 30 incrementally increases the output thereof as shown in one embodiment illustrated in the increasing voltage over time shown in FIG.

Figure 4:
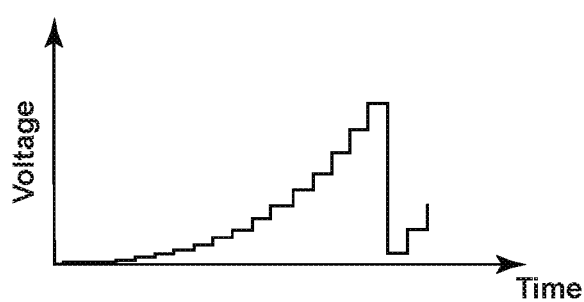
FIG. 4 shows a low slope waveform for when the motion control system is operating in the digital circuit mode in one embodiment.
Figure 5:
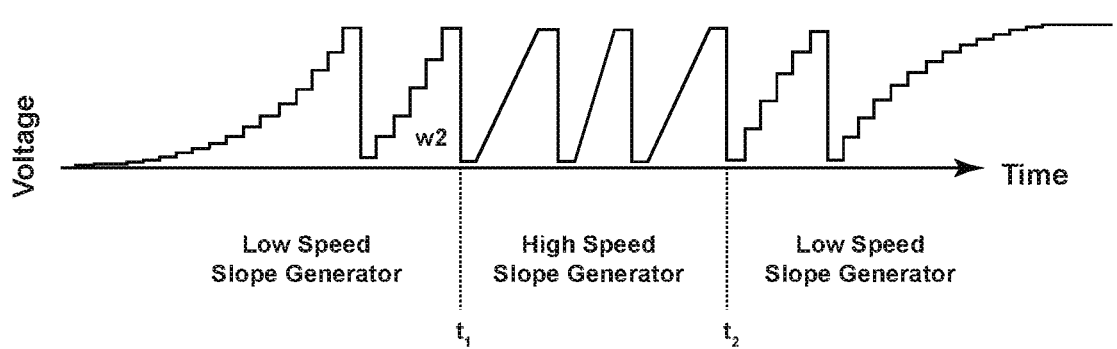
FIG. 5 shows a low slope waveform and high speed waveform for the operating modes of the motion control system in the one embodiment.

4. Thus, the DAC 30 operates as a low speed slope generator to obtain the low speed waveform shown in FIG. 4. In operation, of the digital circuit mode, the DAC 30 is driven until a maximum voltage is obtained, then the voltage output is reset. In operating the piezoelectric motor 90, the reset corresponds to a slip. A portion of FIG. 5 shows a waveform output by the DAC 30 wherein the speed is increased to generate a second waveform W2 much more quickly than the first waveform. The DAC 30 operates as a low speed slope generator by converting a digital signal to an analog signal and providing the waveform to the amplifier 84 via the mode switch S3. The piezo motor 90 receives the waveform to move the mechanical device.

Switching from Digital Circuit Mode to Analog Circuit Mode

The instance wherein the velocity of the slope increases to beyond velocity threshold V1 in FIG. 3 corresponds to time $t_1$ in FIG. 5. In FIG. 2, the processor 24 determines the high velocity threshold V1 and switches (decision step 120) to advance to the high velocity or analog circuit mode. Then, via the analog driver 28, the processor 24 sets the current source 44 (step 140). The DAC 30 does not receive power. The current source 44 outputs a selected current in response to the signal from the analog driver 28. The processor 24 advances to set the mode switch S3 (step 144) to receive the output of the analog hardware circuit 40, if the mode switch S3 is not already set to receive the output of the analog hardware circuit. Then, the high speed slope generator 42 operates (step 150).

High Speed Operation

Figure 7:
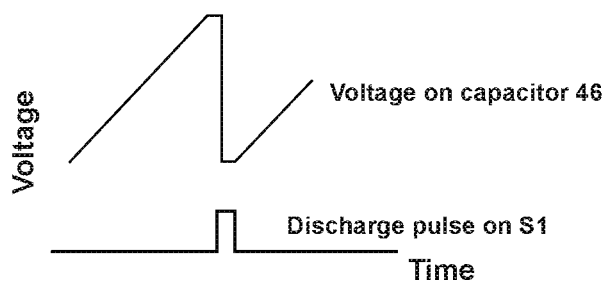
FIG. 7 shows a waveform for an embodiment wherein discharge of a capacitor is provided by a pulse from the analog driver controlling a discharge switch.
Figure 6:
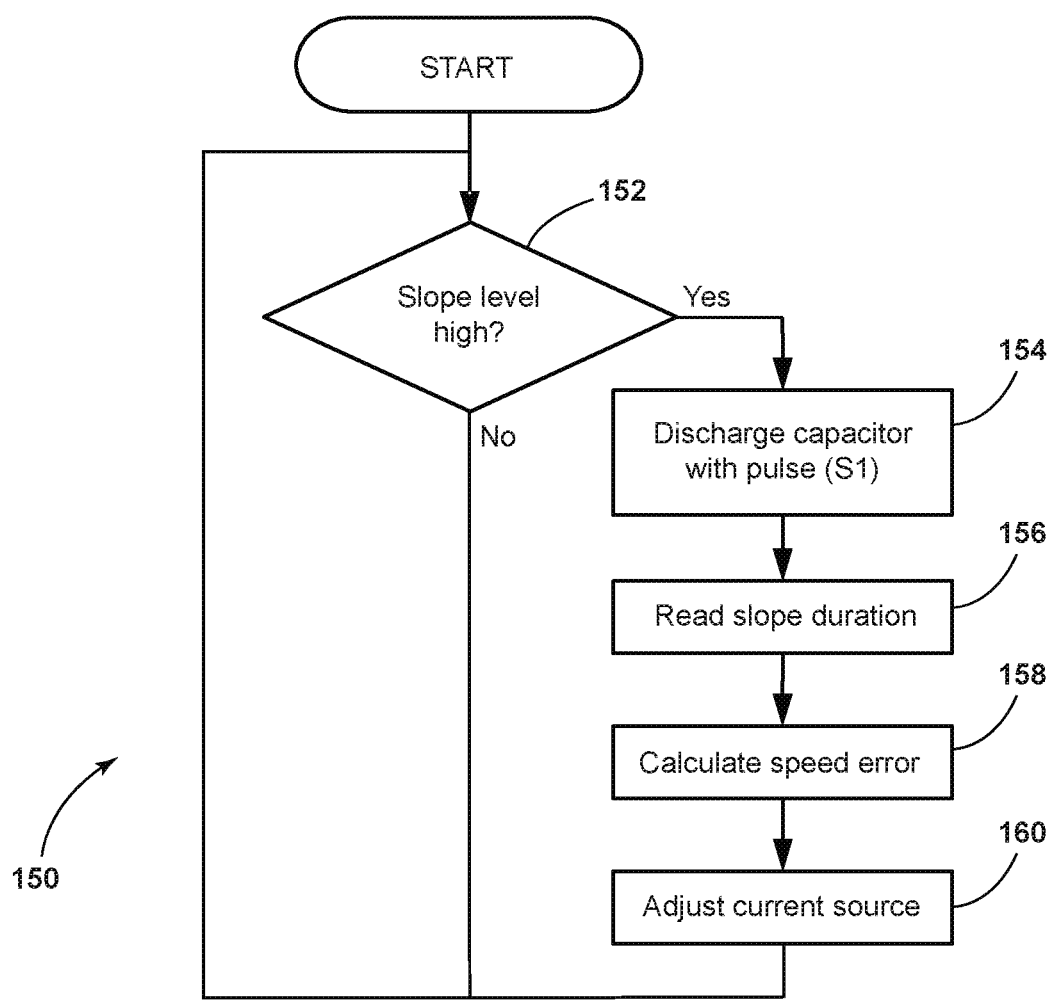
FIG. 6 shows a flow chart of an embodiment operating in the analog circuit mode to provide a high speed waveform.

High speed slope generation by the analog hardware circuit (step 150) including the high speed slop generator 42 is illustrated as a subroutine in FIG. 6. Thus, the features of operating step 150 including a feedback loop are shown in FIG. 6. In operation, the current source 44 is charging the reference capacitor 46. When the slope level does not reach a voltage threshold, the program returns to step 152 and charging of the reference capacitor 46 continues. A desired voltage threshold is obtained (step 152), when the adjustable level sensor 70 senses that the voltage charged on the reference capacitor 46 is greater than or equal to a voltage provided on signal line 71 from the analog driver 28. When the voltage on the reference capacitor 46 reaches the threshold, the voltage level sensor 70 provides a feedback control signal to the analog driver 28. The analog driver 28 is driving the analog hardware circuit 40 by discharging the reference capacitor (step 154). The discharging of the reference capacitor 46 is provided by a pulse from the analog driver 28 controlling the discharge switch S1 as illustrated in the waveform shown in FIG. 7. Then, the analog driver 28 determines the slope duration (step 156) and calculates a speed error (step 158). The speed error is utilized to adjust the current source (step 160). Steps 152 through 160 repeat at a speed much greater than the speed of the processor 24 of the dual mode motion control system 10. Between times $t_1$ and $t_2$ shown in FIG. 5, the high speed slope generation occurs. Much higher slope generating speeds are contemplated than the speed illustrated in FIG. 5.

Returning to FIG. 2, after a number of iterations through the flow chart of FIG. 6, the program also determines a forward/reverse condition (decision step 170) for operating the piezoelectric motor 90. When reverse is selected, motion direction switch S2 is switched (step 174) to provide the output from inverter 64 via the switches S2, S3 to the amplifier 84 (step 136) and to the piezoelectric motor 90. When forward is selected (step 178), the motion direction switch S2 remains in position or is switched so that the signal line 68 provides an output via the switches S2, S3 to the amplifier 84 (step 136). The program shown in FIG. 2 then repeats at step 104.

Switching from Analog Circuit Mode to Digital Circuit Mode

In an instance when the dual mode motion control system 10 switches from high speed slope to low speed slope (step 120) in FIG. 2, the velocity of the slope decreases to less than velocity threshold V2 in FIG. 3, which corresponds to time $t_2$ in FIG. 5. The program calculates a next voltage level (step 124) and sets a desired piezoelectric voltage for the DAC 30. And the mode switch S3 is switched to the low channel output (step 132). The digital circuit mode operates in the manner set forth above. As shown in FIG. 3, the velocity threshold V2 is less than the velocity threshold V1.

The dual mode motion control system 10 performs a method that transitions from the digital circuit mode to the analog circuit mode when the piezo motor 90 is driven at a first predefined speed. The system or method transitions from the analog circuit mode to the digital circuit mode when the piezo motor 90 is driven in the analog circuit mode at a second predefined speed or velocity that is less than the first predefined speed or velocity.

In the digital circuit mode providing low speed slope signals, the processor 24 calculate in real time the desired signal level during each servo cycle thereof. This arrangement provides infinite theoretical resolution, limited only by the numerical (floating point) resolution and resolution of the DAC 30. Compared to the fixed values, or voltage steps, stored in a memory to describe a signal, the disclosed method is a lot more precise and flexible, allowing for any signal shape changes in real time. The limitation though is that this digital method can be used only for low speeds, with pulse rates significantly slower than the servo clock for the processor 24. The electronic controller 40 operates in the digital circuit mode before stopping of the piezo motor 90.

Our solution is unique by combining a digital arrangement to generate the low speed signals, in combination with a hardware generated signal that operates very well at high speeds, which cannot handle low speeds.

Closed Loop System

In one embodiment, the dual mode motion control system 10 includes the position encoder 94 for providing position feedback to the electronic controller 20 for the mechanical device provided with the piezo motor 90. The direct feedback ensures accuracy in the position of the mechanical device by operating as a closed loop system.

Open Loop System

In another embodiment, the dual mode motion control system is an open loop system free from a position encoder. The processor 24 determines or calculates the position of a mechanical device based on the operation of the piezo motor 90. No measurement or position sensing is provided.

Additional Features

As set forth above, the current source 44 is initially controlled by the analog driver 28 based on signals from the processor 24. Thus, the processor 24 via the analog driver 28 controls the reference capacitor charging rate which in turn determines the slope of the signal.

As shown in FIG. 1, the inverter 64 generates the signal for the reverse direction from the same reference capacitor 46/current source 44. Thus, a negative slope is produced instead of a rising slope that triggers an opposite movement by the piezo motor 90.

By using a single reference capacitor 46/current source 44 to generate signals for both directions, perfect signal symmetry at any speeds in the usable range results. In another embodiment, the processor 24 controls the motion direction switch S2 that selects the signals for the two motion directions. The processor 24 controls the mode switch S3 for selecting an output that provides the signals for high and low speed waveforms.

In one embodiment, the electronic controller transitions from the digital circuit mode to the analog circuit mode automatically without a user input at a predefined operating speed for the stick-slip piezo motor.

In some embodiments, the signal shape is independent of the load of the piezo motor 90. Thus any piezo motor 90 can be driven without the need for a driver configuration change.

All charge and discharge delays typically needed for a stick-slip piezo motor 90 are programmable and dynamically changed based on speed and other conditions.

The switches S1, S2, S3 are integrated circuits in some embodiments.

The voltage level sensor 70 is shown as a separate element from the analog driver 28 and the processor 20. In some embodiments, the voltage level sensor 70 is a component of a DSP that includes the controller 20 and the analog driver 28 that drives the analog hardware circuit 40. Thus, the arrangement of FIG. 1 is for purposes of illustration only.

Thus, the embodiments provide, among other things, a dual mode motion control system 10 and method for operating a stick-slip piezo motor 90 in a digital circuit mode at a low speed slope or low operating speed, and in an analog circuit mode at a high speed slope or high operating speed. Various features and advantages of the invention are set forth in the following claims.

What is claimed is:

1. A motion control system for operating a stick-slip piezo motor comprising:
   an analog hardware circuit for providing a high speed waveform at high operating speeds;
   an analog driver for driving the analog hardware circuit;
   a digital-to-analog converter for converting digital signals into analog signals for providing a low speed waveform at low operating speeds;
   a mode switch for selecting one of an output from the analog hardware circuit and an output from the digital-to-analog converter,
   an electronic controller in communication with the analog driver, the analog hardware circuit, the digital-to-analog converter, and the mode switch, the electronic controller configured to:
      control the digital-to-analog converter to output a low speed waveform,
      control the analog driver to drive the analog hardware circuit to output a high speed waveform, and
      control the mode switch to provide the high speed waveform from the analog hardware circuit to the piezo motor or to provide the low speed waveform from the digital-to-analog converter to the piezo motor.

2. The motion control system according to claim 1, wherein the analog hardware circuit includes
   a current source,
   a reference capacitor connected to the current source, and
   a discharge switch for discharging the reference capacitor, wherein the current source and the discharge switch are controlled by the analog driver.

3. The motion control system according to claim 2, wherein the analog hardware circuit includes
   an inverter having an input connection between the current source and the reference capacitor; and
   a motion direction switch having a first input connected between the current source and the reference capacitor, the motion direction switch having a second input connected to an output of the inverter, and an output of the motion direction switch is connected to an input of the mode switch.

4. The motion control system according to claim 3, further including:
   an amplifier configured to receive an output of the mode switch, and
   a piezo motor for receiving an output of the amplifier, the control system controlling the piezo motor for movement of a mechanical device.

5. The motion control system according to claim 4, the analog hardware circuit including a voltage level sensor for providing a feedback control signal to the analog driver, the voltage level sensor having an input connection connected between the current source and the reference capacitor.

6. The motion control system according to claim 4, wherein the motion control system includes a position encoder for providing position feedback for the mechanical device to the electronic controller, and wherein the motion control system is a closed loop system.

7. The motion control system according to claim 4, wherein the motion control system is an open loop system free from a position encoder.

8. The motion control system according to claim 1, wherein the electronic controller includes a processor and a non-transitory memory, and wherein the electronic controller receives commands from a user interface.

9. The motion control system according to claim 8, wherein the processor processes commands received from the user interface to generate a motion profile, and selectively provides drive signals to either the analog driver or the digital-to-analog converter to drive the piezo motor.

10. The motion control system according to claim 1, wherein the low speed waveform has slope that is less than a slope of the high speed waveform.

11. A method for controlling a stick-slip piezo motor with an electronic controller and an analog driver for moving a mechanical device when movement is selected, the method comprising:
    operating in a digital circuit mode with the electronic controller to move the stick-slip piezo motor at a low speed; and
    selectively operating in an analog circuit mode with the electronic controller and the analog driver to move the stick-slip piezo motor at a high speed,
    wherein the electronic controller operates in the digital circuit mode at start-up of the piezo motor.

12. The method according to claim 11, wherein the electronic controller operates in the digital circuit mode before stopping of the piezo motor.

13. The method according to claim 11, wherein the electronic controller transitions from the digital circuit mode to the analog circuit mode automatically without a user input at a predefined operating speed for the stick-slip piezo motor.

14. The method according to claim 13, wherein in the analog circuit mode, the controller provides driver instructions to the analog driver that drives an analog hardware circuit to power the stick-slip piezo motor.

15. The method according to claim 11, wherein the method transitions from the digital circuit mode to the analog circuit mode when the piezo motor is driven at a first predefined speed, and wherein the method transitions from the analog circuit mode to the digital circuit mode when the piezo motor is driven in the analog circuit mode at a second predefined speed that is less than the first predefined speed.

16. The method according to claim 11, including a position encoder for providing position feedback for the mechanical device to the electronic controller, and wherein a motion control system for controlling the piezo motor is a closed loop system.

17. The method according to claim 11, wherein the electronic controller includes a processor and a non-transitory memory, and wherein the electronic controller receives commands from a user interface.

18. The method according to claim 17, wherein operating in the analog circuit mode, the analog driver drives an analog hardware circuit, the analog hardware circuit including a current source, a reference capacitor connected to the current source, and a discharge switch for discharging the reference capacitor, wherein the current source and the discharge switch are controlled by the analog driver.

19. The method according to claim 18, wherein operating in the digital circuit mode, the electronic controller controls a digital-to-analog converter for converting digital signals into analog signals to provide a low speed waveform at low operating speeds.

20. The method according to claim 19, including an amplifier configured to receive the analog signals and provide an output to a piezo motor for moving a mechanical device.

\* \* \* \* \*